United States Patent
Iseki et al.

(10) Patent No.: US 6,174,371 B1
(45) Date of Patent: Jan. 16, 2001

(54) SUBSTRATE TREATING METHOD AND APPARATUS

(75) Inventors: Izuru Iseki; Tetsuro Yamashita, both of Kyoto (JP)

(73) Assignee: Dainippon Screen Mfg. Co., Ltd. (JP)

( * ) Notice: Under 35 U.S.C. 154(b), the term of this patent shall be extended for 0 days.

(21) Appl. No.: 09/153,957

(22) Filed: Sep. 16, 1998

(30) Foreign Application Priority Data

Oct. 6, 1997 (JP) .................................................. 9-272391
Oct. 20, 1997 (JP) .................................................. 9-286727

(51) Int. Cl.$^7$ .............................. C23C 16/00; H05H 1/00
(52) U.S. Cl. ......................... 118/689; 118/726; 118/728; 156/345
(58) Field of Search ..................................... 118/689, 708, 118/690, 692, 725, 726, 724, 728, 715; 156/345

(56) References Cited

U.S. PATENT DOCUMENTS

| | | | |
|---|---|---|---|
| 5,372,754 | * 12/1994 | One ...................................... | 118/726 |
| 5,966,499 | * 10/1999 | Hinkle et al. ......................... | 118/726 |
| 6,039,809 | * 3/2000 | Toyama et al. ...................... | 118/726 |
| 6,090,176 | * 7/2000 | Yoshitake et al. ................... | 118/728 |

* cited by examiner

Primary Examiner—Gregory Mills
Assistant Examiner—Parviz Hassanzadeh
(74) Attorney, Agent, or Firm—Ostrolenk, Faber, Gerb & Soffen, LLP (57) ABSTRACT

A substrate treating method and apparatus are disclosed which are capable of heating a substrate in a stable atmosphere including the vapor of a treating liquid, without permitting the vapor of the treating liquid to condense on the substrate. The vapor of the treating liquid is mixed with a diluting gas to form a treating vapor mixture. At this time, the flow rate of the diluting gas is adjusted so that the partial pressure ratio of the vapor of the treating liquid in the treating vapor mixture increases with the passage of time. This treating vapor mixture is transmitted to a treating chamber. The treating chamber includes a substrate support table heated to a predetermined temperature. When the substrate is lowered from a separate position away from the support table to a position resting on the support table, downward displacements of the substrate are controlled so that the vapor of the treating liquid in the treating vapor mixture present adjacent the substrate surface under treatment is maintained substantially at a saturation pressure. In another method disclosed, the partial pressure ratio of the vapor of the treating liquid in the treating vapor mixture is adjusted according to the downward displacements of the substrate.

13 Claims, 7 Drawing Sheets

Fig.8A start lowering — finish lowering — start raising — finish raising

SUBSTRATE TREATING METHOD AND APPARATUS

BACKGROUND OF THE INVENTION

1. Field of the Invention

The present invention relates to substrate treating methods and apparatus for use in modifying films formed on substrates such as semiconductor wafers. More particularly, the invention relates to a technique of heating substrates in an atmosphere including the vapor of a treating liquid or solution.

2. Description of the Related Art

Figure 1:
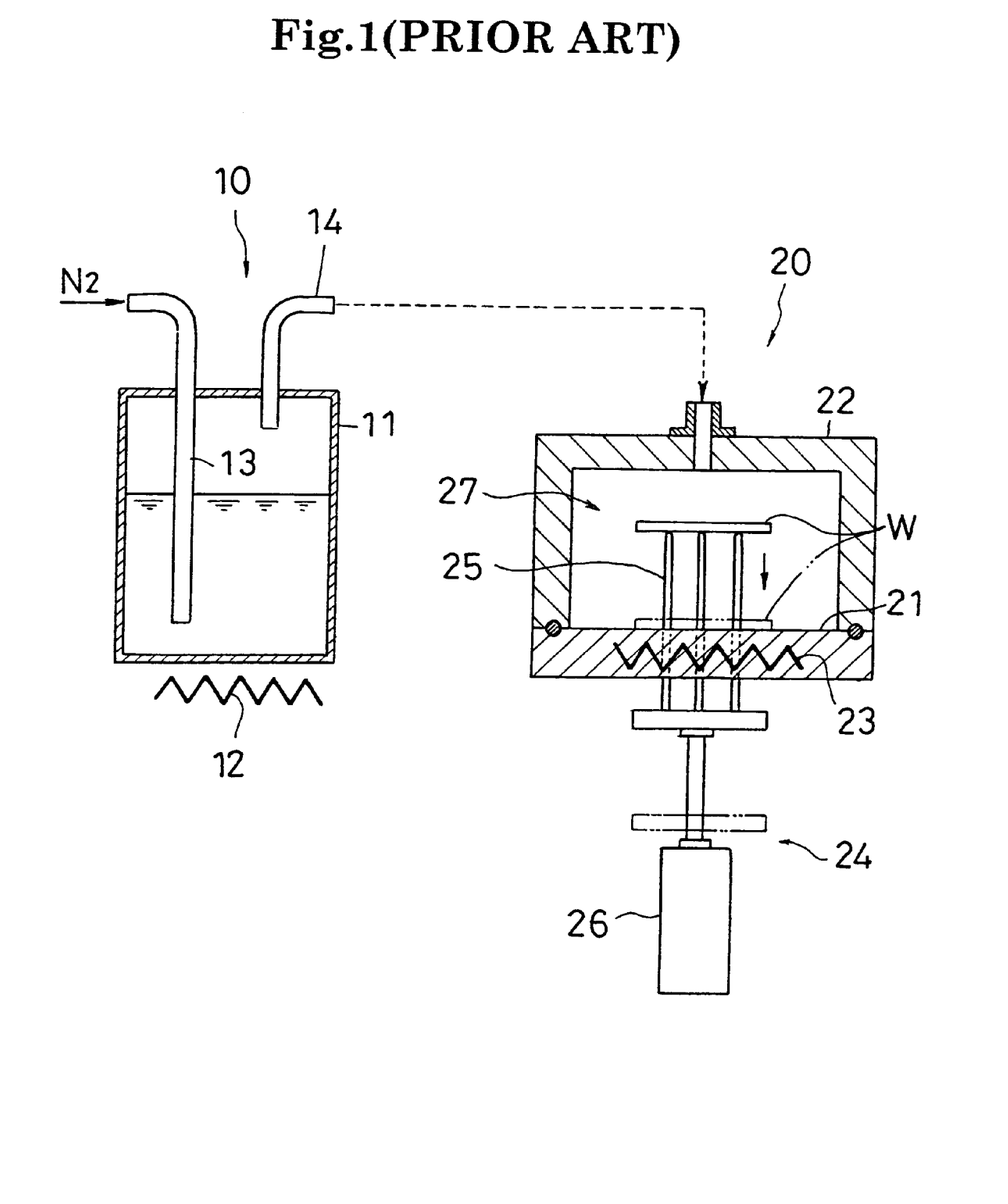
FIG. 1 is a view showing an outline of a conventional substrate treating apparatus.

An outline of a conventional substrate treating apparatus of this type will be described with reference to FIG. 1.

This substrate treating apparatus includes a vaporizer 10 for vaporizing a treating liquid, and a treating chamber 20 for treating substrate or wafer W in the vapor of the treating liquid supplied from the vaporizer 10.

The vaporizer 10 has a bubbling tank 11 for storing the treating liquid which is heated by a heater 12 provided for the bubbling tank 11. A gas feed pipe 13 extends into the bubbling tank 11 for mixing a carrier gas such as nitrogen gas into the treating liquid. A vapor transmitting pipe 14 extends from an upper position of the bubbling tank 11. The vapor of the treating liquid generated by heating is transmitted along with the carrier gas through the vapor transmitting pipe 14 to the treating chamber 20.

The treating chamber 20 includes a substrate support table 21 for supporting a substrate such as a semiconductor wafer W under treatment, and an open/close main body 22 disposed over the support table 21. The support table 21 has a heater 23 embedded therein for heating the wafer W, and a lift mechanism 24 for raising and lowering the wafer W. The lift mechanism 24 includes a plurality of support pins 25 for supporting the wafer W, and an air cylinder 26 for raising and lowering the support pins 25. The vapor transmitting pipe 14 is connected to an upper position of the main body 22 to introduce the vapor of the treating liquid into a treating space 27 defined by the main body 24.

The conventional substrate treating apparatus noted above is operable for treatment of wafer W as follows.

With the main body 22 retracted upward to open the treating space 27, the wafer W is brought in and placed on the support pins 25 projecting from the support table 21. Subsequently, the main body 22 is lowered to close the treating space 27 tight. As the vapor of the treating liquid is introduced from the vaporizer 10 into the treating space 27, the support pins 25 are lowered to place the wafer W on the support table 21. The wafer W is treated in a vaporous atmosphere of the treating liquid while being heated by the support table 21.

The above conventional substrate treating apparatus has the following drawback.

When the vapor of the treating liquid is introduced into the treating space 27, the wafer W is in a position away from the support table 21, and is therefore below a heating temperature set to the support table 21. As a result, the temperature of the wafer W is lower than the temperature of the vapor of the treating liquid introduced into the treating space 27. The vapor of the treating liquid introduced into the treating space 27 is cooled adjacent the wafer W and condenses on the wafer W. The condensation degrades the film formed on the surface of wafer W under treatment.

To overcome such an inconvenience, the wafer W may be placed and heated on the support table 21 prior to introduction into the treating space 27 of the vapor of the treating liquid. In the case of treatment conducted in such a sequence, the film formed on the wafer W would temporarily be heated in an atmosphere not including the vapor of the treating liquid. Certain types of film require treatment in the vapor of the treating liquid in order to avoid dispersion of components contained in the film. The treatment conducted in the above sequence would disperse the components from the film, resulting in a different problem of deteriorating the film.

SUMMARY OF THE INVENTION

The present invention has been made having regard to the state of the art noted above, and its object is to provide a substrate treating method and apparatus for heating a substrate in a stable atmosphere including the vapor of a treating liquid or solution, without allowing the vapor to condense on the substrate.

The above object is fulfilled, according to a first aspect of the present invention, by a substrate treating method for heating a substrate in an atmosphere including vapor of a treating liquid, comprising a treating vapor mixture generating step for generating a treating vapor mixture by mixing the vapor of the treating liquid with a diluting gas; a partial pressure ratio adjusting step for varying a mixing quantity of at least one of the vapor of the treating liquid and the diluting gas in the treating vapor mixture generating step, so that a partial pressure ratio of the vapor of the treating liquid in the treating vapor mixture increases with time; a treating vapor mixture transmitting step for transmitting the treating vapor mixture to a treating chamber having a substrate support table heated to a predetermined temperature and for supporting the substrate; a substrate lowering step for lowering the substrate in the treating chamber from a separate position away from the substrate support table to a resting position on the substrate support table; and a downward displacement controlling step for controlling downward displacements of the substrate in the substrate lowering step, according to variations in the partial pressure ratio of the vapor of the treating liquid in the treating vapor mixture, to maintain a substantially fixed ratio between a vapor pressure and a saturation pressure of the vapor of the treating liquid in the treating vapor mixture adjacent a surface of the substrate under treatment.

The invention provides also an apparatus according to the first aspect, which employs the method according to the first aspect.

That is, a substrate treating apparatus for heating a substrate in an atmosphere including vapor of a treating liquid, according to the first aspect of the invention, comprises a treating vapor mixture generating unit for generating a treating vapor mixture by mixing the vapor of the treating liquid with a diluting gas; a treating chamber for receiving the treating vapor mixture; a substrate support table disposed in the treating chamber, heated to a predetermined temperature and for supporting the substrate; a substrate lift mechanism for raising and lowering the substrate between a separate position away from the substrate support table and a resting position on the substrate support table; a partial pressure ratio adjusting device for varying a mixing quantity of at least one of the vapor of the treating liquid and the diluting gas, so that a partial pressure ratio of the vapor of the treating liquid in the treating vapor mixture generated by the treating vapor mixture generating unit increases with time; and a drive control device for controlling downward displacements of the substrate lowered by the substrate lift mechanism from the separate position to the resting position in the treating chamber, according to variations in the partial pressure ratio of the vapor of the treating liquid in the treating vapor mixture, to maintain a substantially fixed ratio between a vapor pressure and a saturation pressure of the vapor of the treating liquid in the treating vapor mixture adjacent a surface of the substrate under treatment.

The functions and advantages of the above apparatus in the first aspect of the invention will be described hereinafter. The functions and advantages of the method in the first aspect of the invention will be apparent from those of the apparatus, and will not be described to avoid repetition.

A substrate loaded into the treating chamber is first placed by the substrate lift mechanism in the separate position away from the substrate support table. Subsequently, the treating vapor mixture generated by mixing the vapor of the treating liquid with the diluting gas at the treating vapor mixture generating unit is fed into the treating chamber. At this time, the partial pressure ratio adjusting device varies the mixing quantity of at least one of the vapor of the treating liquid and the diluting gas so that the partial pressure ratio of the vapor of the treating liquid in the treating vapor mixture increases with the passage of time. When the treating vapor mixture with the adjusted partial pressure ratio of the vapor of the treating liquid is fed into the treating chamber, the substrate lift mechanism lowers the substrate. At this time, the drive control device controls downward displacements of the substrate lowered by the substrate lift mechanism, according to variations in the partial pressure ratio of the vapor of the treating liquid in the treating vapor mixture, to maintain a substantially fixed ratio between a vapor pressure and a saturation pressure of the vapor of the treating liquid in the treating vapor mixture adjacent a surface of the substrate under treatment.

That is, in an initial stage of substrate treatment, the substrate is maintained at a relatively low temperature in the separate position away from the substrate support table in response to a low partial pressure ratio of the vapor of the treating liquid in the treating vapor mixture fed to the treating chamber. With the substrate at a low temperature, the vapor of the treating liquid in the treating vapor mixture adjacent the substrate has a low saturation pressure because of the temperature dependence of the saturation pressure. However, the vapor of the treating liquid at the low partial pressure ratio never condenses. As the partial pressure ratio of the vapor of the treating liquid in the treating vapor mixture fed to the treating chamber increases, the substrate is lowered toward the substrate support table, thereby increasing the temperature of the substrate. As the temperature of the substrate increases, the saturation pressure of the vapor of the treating liquid in the treating vapor mixture present adjacent the substrate increases. In other words, the substrate is lowered and placed on the substrate support table while maintaining a substantially fixed ratio between the vapor pressure and saturation pressure of the vapor of the treating liquid in the treating vapor mixture adjacent the surface of the substrate under treatment. Consequently, the vapor of the treating liquid never condenses on the substrate. The pressure of the vapor of the treating liquid is maintained substantially constant throughout the substrate treatment. Thus, the substrate may be heated in a stable atmosphere including the vapor of the treating liquid.

In the method and apparatus according to the first aspect of the invention noted above, the partial pressure ratio of the vapor of the treating liquid in the treating vapor mixture, preferably, is adjusted by varying the mixing quantity of the diluting gas. The partial pressure ratio of the vapor of the treating liquid may be adjusted with high precision by varying the mixing quantity of the diluting gas, which assures substrate treatment with increased stability.

In the method and apparatus according to the first aspect of the invention noted above, the downward displacements of the substrate, preferably, is controlled according to variations in the partial pressure ratio of the vapor of the treating liquid in the treating vapor mixture, to maintain the vapor of the treating liquid in the treating vapor mixture adjacent the surface of the substrate under treatment substantially at the saturation pressure. With the vapor of the treating liquid in the treating vapor mixture adjacent the surface of the substrate under treatment maintained substantially at the saturation pressure, condensation of the vapor of the treating liquid is prevented and dispersion of components from the film formed on the substrate surface under treatment is minimized, thereby to improve quality of the treated substrate.

In the apparatus according to the first aspect of the invention noted above, the treating vapor mixture generating unit may include a bubbling tank for generating the vapor of the treating liquid by heating the treating liquid, and a mixer for mixing the vapor of the treating liquid generated in the bubbling tank with the diluting gas. Preferably, a vapor temperature regulator also is provided for cooling the vapor of the treating liquid generated in the bubbling tank, to a temperature close to the temperature set to the substrate support table, before transmitting the vapor to the mixer. With the vapor temperature regulator, the treating liquid may be heated by an increased temperature to promote vaporization thereof in the bubbling tank, and condensation of the vapor of the treating liquid in the treating chamber may be prevented with increased effect.

The treating vapor mixture generating unit may be the type including a sealed receptacle, a double pipe opening to the receptacle, and a heater for heating an interior of the receptacle, the double pipe having an inner pipe for feeding the treating liquid, and an outer pipe for feeding the diluting gas, the inner pipe and the outer pipe having restricted ends, a vapor transmitting pipe being connected to a position of the receptacle opposite to the double pipe.

In the apparatus according to the first aspect of the invention noted above, the substrate lift mechanism, preferably, includes a plurality of support pins projectable from the substrate support table for supporting the substrate, and a screw feed mechanism driven by an electric motor for raising and lowering a support member supporting the support pins. With this substrate lift mechanism, the support pins supporting the substrate are raised and lowered by the screw feed mechanism driven by the electric motor. The downward displacements of the substrate may be controlled with high precision by controlling rotation of the electric motor by the drive control device. This provides the advantage of further diminishing variations in the ratio between the vapor pressure and saturation pressure of the vapor of the treating liquid in the treating vapor mixture present adjacent the surface of the substrate under treatment.

The present invention provides, as a second aspect thereof, a substrate treating method for heating a substrate in an atmosphere including vapor of a treating liquid, comprising a treating vapor mixture generating step for generating a treating vapor mixture by mixing the vapor of the treating liquid with a diluting gas; a treating vapor mixture transmitting step for transmitting the treating vapor mixture to a treating chamber having a substrate support table heated to a predetermined temperature and for supporting the substrate; a substrate lowering step for lowering the substrate in the treating chamber from a separate position away from the substrate support table to a resting position on the substrate support table; and a partial pressure ratio adjusting step for adjusting a partial pressure ratio of the vapor of the treating liquid in the treating vapor mixture by varying a mixing quantity of at least one of the vapor of the treating liquid and the diluting gas in the treating vapor mixture generating step, according to downward displacements of the substrate, to maintain, in the substrate lowering step, a substantially fixed ratio between a vapor pressure and a saturation pressure of the vapor of the treating liquid in the treating vapor mixture adjacent a surface of the substrate under treatment.

The invention provides also an apparatus according to the second aspect, which employs the method according to the second aspect.

This substrate treating apparatus for heating a substrate in an atmosphere including vapor of a treating liquid, comprises a treating vapor mixture generating unit for generating a treating vapor mixture by mixing the vapor of the treating liquid with a diluting gas; a treating chamber for receiving the treating vapor mixture; a substrate support table disposed in the treating chamber, heated to a predetermined temperature and for supporting the substrate; a substrate lift mechanism for raising and lowering the substrate between a separate position away from the substrate support table and a resting position on the substrate support table; and a partial pressure ratio adjusting device for adjusting a partial pressure ratio of the vapor of the treating liquid in the treating vapor mixture by varying a mixing quantity of at least one of the vapor of the treating liquid and the diluting gas in the treating vapor mixture generating device, according to downward displacements of the substrate, to maintain a substantially fixed ratio between a vapor pressure and a saturation pressure of the vapor of the treating liquid in the treating vapor mixture adjacent a surface of the substrate under treatment when the substrate is lowered by the substrate lift mechanism from the separate position to the resting position in the treating chamber.

The functions and advantages of the above apparatus in the second aspect of the invention will be described hereinafter. The functions and advantages of the method in the second aspect of the invention will be apparent from those of the apparatus, and will not be described to avoid repetition.

A substrate loaded into the treating chamber is first placed by the substrate lift mechanism in the separate position away from the substrate support table. Subsequently, the treating vapor mixture generated by mixing the vapor of the treating liquid with the diluting gas at the treating vapor mixture generating unit is fed into the treating chamber. At substantially the same time as the feeding of the treating vapor mixture into the treating chamber, the substrate lift mechanism lowers the substrate. During the descent of the substrate, the partial pressure ratio adjusting device adjusts the partial pressure ratio of the vapor of the treating liquid in the treating vapor mixture by varying a mixing quantity of at least one of the vapor of the treating liquid and the diluting gas according to downward displacements of the substrate, to maintain a substantially fixed ratio between a vapor pressure and a saturation pressure of the vapor of the treating liquid in the treating vapor mixture adjacent a surface of the substrate under treatment.

That is, in an initial stage of descent of the substrate, the substrate is maintained at a relatively low temperature since the substrate remains remote from the substrate support table. With the substrate at a low temperature, the vapor of the treating liquid in the treating vapor mixture adjacent the substrate has a low saturation pressure because of the temperature dependence of the saturated vapor pressure. Thus, in order to lower the pressure of the vapor of the treating liquid in the treating vapor mixture in the initial stage of descent of the substrate, the partial pressure ratio adjusting device adjusts the mixing quantity of at least one of the vapor of the treating liquid and the diluting gas to lower the partial pressure ratio of the vapor of the treating liquid in the treating vapor mixture. By adjusting the partial pressure ratio of the vapor of the treating liquid as above, oversaturation of the vapor of the treating liquid in the treating vapor mixture present adjacent the substrate is avoided even when the substrate is at a low temperature in the initial stage of its descent. Thus, the vapor of the treating liquid is prevented from condensing on the substrate surface under treatment.

As the substrate is lowered toward the heated substrate support table, the temperature of the substrate increases gradually. As the temperature of the substrate increases, the saturation pressure of the vapor of the treating liquid in the treating vapor mixture present adjacent the substrate increases. In response to the increase in the saturation pressure, the partial pressure ratio adjusting device gradually increases the partial pressure ratio of the vapor of the treating liquid in the treating vapor mixture to increase the vapor pressure. Consequently, throughout the descent of the substrate, a substantially fixed ratio is maintained between the vapor pressure and saturation pressure of the vapor of the treating liquid in the treating vapor mixture adjacent the surface of the substrate under treatment. The substrate temperature is constant after the substrate is placed on the support table, Thus, the partial pressure ratio of the vapor of the treating liquid in the treating vapor mixture is maintained constant.

In the method and apparatus according to the second aspect, as in the method and apparatus according to the first aspect described hereinbefore, the partial pressure ratio of the vapor of the treating liquid in the treating vapor mixture, preferably, is adjusted by varying the mixing quantity of the diluting gas.

In the method and apparatus according to the second aspect, the partial pressure ratio of the vapor of the treating liquid in the treating vapor mixture, preferably, is adjusted by varying the mixing quantity of at least one of the vapor of the treating liquid and the diluting gas in the treating vapor mixture generating device, according to the downward displacements of the substrate, to maintain the vapor of the treating liquid in the treating vapor mixture adjacent the surface of the substrate under treatment substantially at the saturation pressure when the substrate is lowered.

The apparatus according to the second aspect may advantageously employ the treating vapor mixture generating unit of the apparatus according to the first aspect noted hereinbefore.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIGS. 8A through 8D are views showing an operating sequence of the apparatus in the second embodiment, in which:

DESCRIPTION OF THE PREFERRED EMBODIMENTS

Preferred embodiments of the present invention will be described in detail hereinafter with reference to the drawings.

<First Embodiment>

Figure 2:
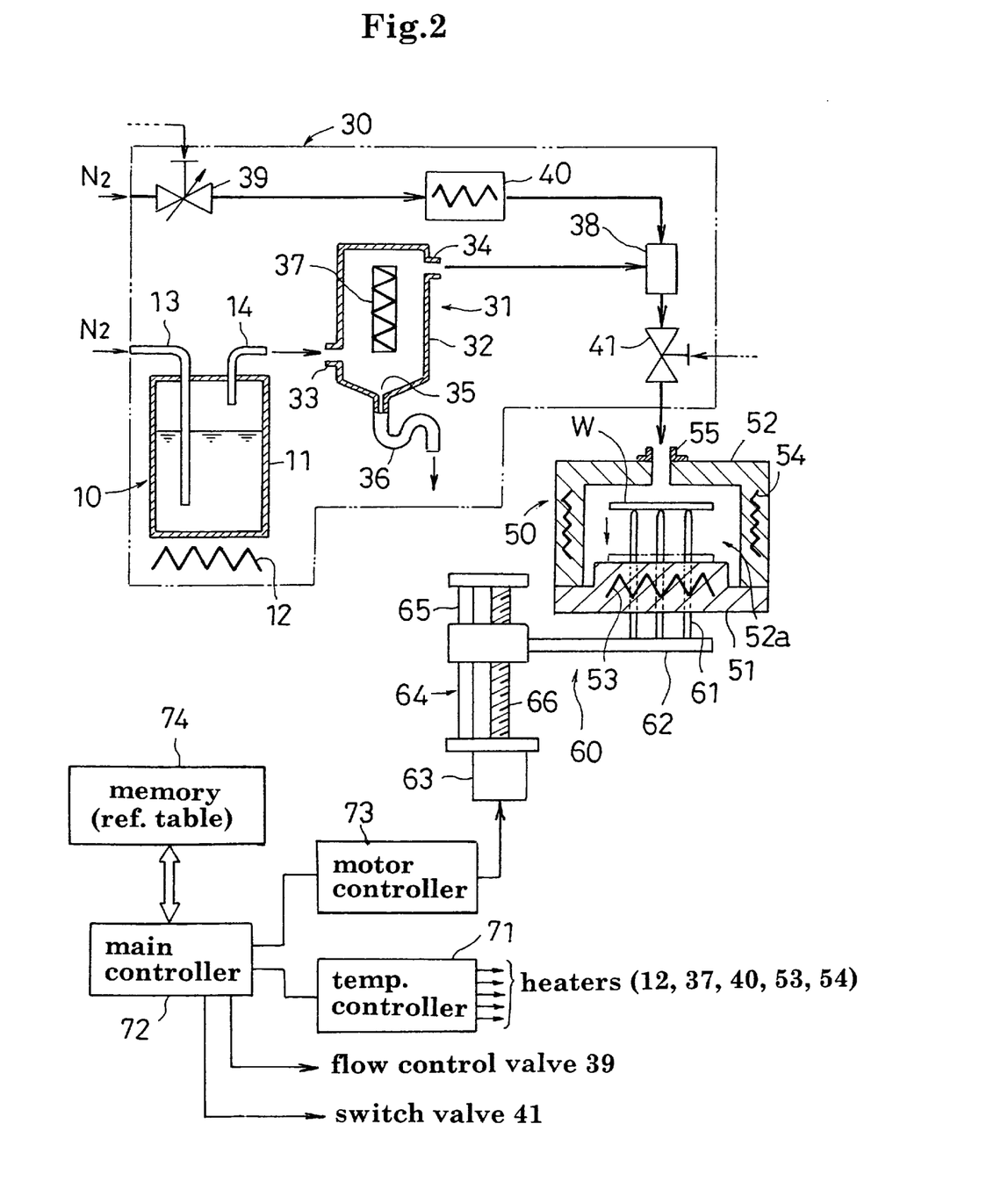
FIG. 2 is a view showing an outline of a substrate treating apparatus in a first embodiment.

FIG. 2 is a schematic view of a substrate treating apparatus in a first embodiment of the invention. This substrate treating apparatus, broadly, is composed of a treating vapor mixture generating unit 30 for generating a treating vapor mixture by mixing the vapor of a treating liquid with a diluting gas, a treating chamber 50 for receiving the treating vapor mixture from the vapor mixture generating unit 30 and heat-treating substrates in the vapor mixture, and a control system for controlling the vapor mixture generating unit 30 and treating chamber 50.

The vapor mixture generating unit 30 includes a vaporizer 10 for generating the vapor of the treating liquid. This vaporizer 10 is similar in construction to the conventional vaporizer illustrated in FIG. 1. The vapor is generated by heating the treating liquid in a bubbling tank 11 with a heater 12. The vapor is mixed with a carrier gas (e.g. nitrogen gas) introduced into the bubbling tank 11 through a gas feed pipe 13, and is outputted from the vaporizer 10 through a vapor transmitting pipe 14. The treating liquid is not limited to any particular type, but may be deionized water, ammonia water or an organic solvent, for example.

The vapor mixture generating unit 30 further includes a vapor temperature regulator 31 disposed at a stage following the vaporizer 10. The vapor temperature regulator 31 has a receptacle 32 of hermetic structure. The receptacle 32 has a vapor inlet 33 formed in a lower position thereof for receiving the vapor of the treating liquid. The receptacle 32 has a vapor outlet 34 formed in an upper position thereof for letting out the vapor of the treating liquid after a temperature adjustment. Further, the receptacle 32 has a drain port 35 formed in a bottom thereof for discharging a liquid resulting from condensation of the vapor of the treating liquid. A drain pipe 36 connected to the drain port 35 includes a U-shaped trap for preventing the vapor of the treating liquid introduced into the receptacle 32 from being discharged through the drain port 35. The receptacle 32 further includes thermoelectric conversion elements 37 such as Peltier elements mounted therein for adjusting the temperature of the vapor of the treating liquid. This embodiment utilizes the cooling function of thermoelectric conversion elements 37 to cool the vapor of the treating liquid received from the vaporizer 10 to a level close to a substrate treating temperature in the treating chamber 50 (i.e. a temperature set to a substrate support table 51).

With this vapor temperature regulator 31, even though the vaporizer 10 heats the treating liquid to an increased temperature to promote its vaporization, the vapor of the treating liquid taken into the vapor temperature regulator 31 is cooled in the receptacle 32 to a level close to the substrate treating temperature in the treating chamber 50. As a result, superfluous part of the vapor may be condensed in and discharged from the receptacle 32 in advance. This provides an increased effect of preventing condensation of the vapor of the treating liquid in the treating chamber 50.

At a stage following the vapor temperature regulator 31 is a mixer 38 for mixing the temperature-adjusted vapor of the treating liquid with a diluting gas such as nitrogen gas. A line for feeding the diluting gas to the mixer 38 includes, as arranged from upstream to downstream, a flow control valve 39 for adjusting a flow rate of the diluting gas, and a heater 40 for heating the diluting gas, the flow rate of which has been adjusted by the flow control valve 39, to a temperature close to the substrate treating temperature in the treating chamber 50. The mixer 38 produces a treating vapor mixture by mixing the vapor of the treating liquid and the diluting gas, and the mixture is transmitted to the treating chamber 50 via a switch valve 41.

The treating chamber 50 includes the substrate support table 51 for supporting a wafer W under treatment, and an open/close main body 52 disposed over the support table 51. The support table 51 and main body 52 define a sealed space serving as a treating space 52a. The support table 51 has a heater 53 embedded therein for heating the wafer W placed on the table 51. The main body 52 also has a heater 54 embedded therein for preventing the treating vapor mixture introduced into the treating chamber 50 from being cooled by and condensing on walls of the main body 52. The main body 52 defines a vapor inlet 55 centrally thereof for communication with the switch valve 41. The wafer W transported into the treating space 52a of treating chamber 50 is vertically movable by a substrate lift mechanism 60 between a position separate from the support table 51 and a position on the support table 51. The lift mechanism 60 includes three support pins 61 vertically extending through the support table 51 to be projectable above and retractable below an upper surface of support table 51. The support pins 61 have proximal ends thereof connected to and supported by a support member 62. The support member 62 is raised and lowered by a screw feed mechanism 64 driven by an electric motor such as a stepping motor 63. Specifically, the support member 62 has a proximal end thereof engaged with a guide rail 65 to be guided vertically, and with a screw shaft 66 rotatable by the stepping motor 63, whereby the support pins 61 are raised and lowered with the support member 62.

The control system of the apparatus in this embodiment will be described next.

The heater 12, thermoelectric conversion elements 37 and heater 40 of the treating vapor mixture generating unit 30, and the heaters 53 and 54 of the treating chamber 50 (which are hereinafter collectively called "heaters") are connected to a temperature controller 71. The temperature controller 71 effects temperature controls of the heaters upon instructions from a main controller 72 for setting temperatures to the heaters. The heaters have temperature sensors, not shown, attached thereto. The temperature sensors transmit detection signals to the temperature controller 71, respectively, for use in the temperature controls of the heaters.

Figure 3:
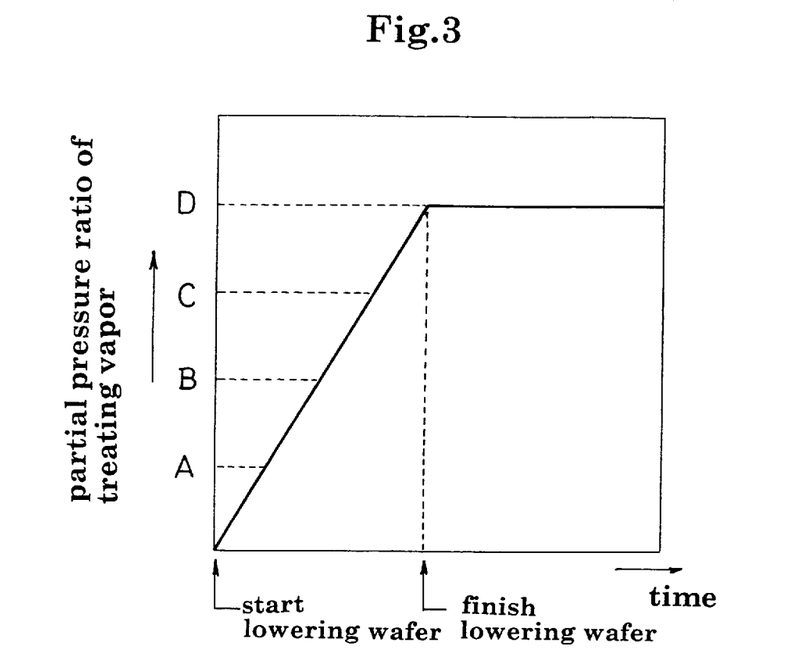
FIG. 3 is a view showing variations in the partial pressure ratio of the vapor of a treating liquid.

The main controller 72 controls the flow control valve 39 to adjust the flow rate of the diluting gas, such that the vapor of the treating liquid in the treating vapor mixture obtained from the mixer 38 has a partial pressure ratio increasing with the passage of time. In this embodiment, as shown in FIG. 3, the partial pressure ratio of the vapor of the treating liquid in the treating vapor mixture, i.e. the ratio of a flow rate of the vapor of the treating liquid to a total flow rate of the diluting gas ($N_2$) whose flow rate is adjusted by the flow control valve 39 and the carrier gas ($N_2$) introduced into the vaporizer 10, is increased proportionally with the passage of time from a point of time when the wafer W in the position separated from the substrate support table 51 begins to descend to a point of time when the wafer W completes the descent on the support table 51. After the wafer W is placed on the support table 51, the partial pressure ratio is maintained at a fixed value (at partial pressure ratio D in the example shown in FIG. 3). This function of the main controller 72, and the flow control valve 39, correspond to the partial pressure ratio adjusting device of the apparatus in the first aspect of the present invention.

Further, the main controller 72 controls downward displacements of wafer W through the substrate lift mechanism 60 according to the variations in the partial pressure ratio of the vapor of the treating liquid shown in FIG. 3, such that, in the course of lowering the wafer W from the position separated from the support table 51 to the position on the support table 51 (hereinafter also called "descent of wafer W"), the vapor of the treating liquid in the treating vapor mixture adjacent the surface of wafer W under treatment is maintained substantially at a saturation pressure. This control of downward displacements of wafer W will be described hereinafter with reference to FIGS. 4 and 5.

Figure 4:
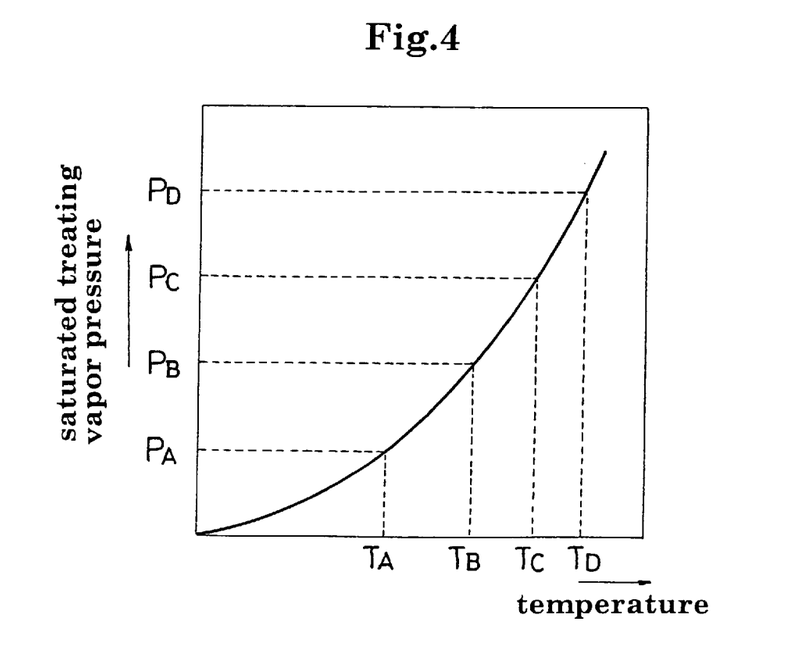
FIG. 4 is a view showing a relationship between saturated vapor pressure and temperature of the vapor of the treating liquid.

When the partial pressure ratio of the vapor of the treating liquid in the treating vapor mixture is varied as shown in FIG. 3, the pressure of the vapor of the treating liquid in the treating vapor mixture corresponding to each partial pressure ratio equals a saturation pressure at a definite temperature. Where, for example, the pressures of the vapor of the treating liquid corresponding to partial pressure ratios A, B, C and D in FIG. 3 are saturated vapor pressures $P_A$, $P_B$, $P_C$ and $P_D$, these saturated vapor pressures $P_A$, $P_B$, $P_C$ and $P_D$ have a relationship of correspondence with temperatures $T_A$, $T_B$, $T_C$ and $T_D$ as shown in FIG. 4. That is, saturation pressure increases with temperature.

Figure 5:
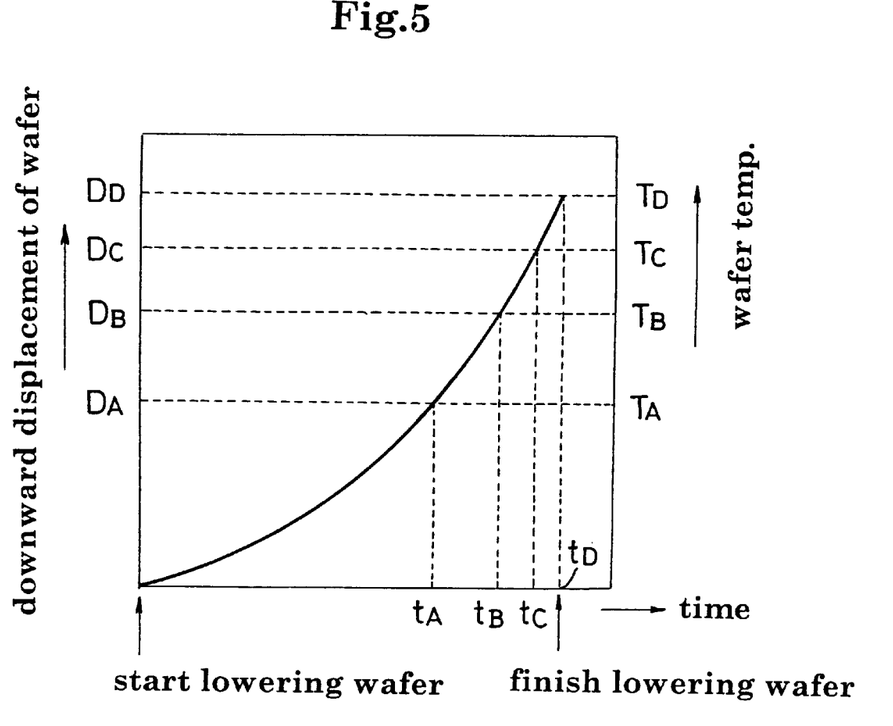
FIG. 5 is a view showing time variations in the downward displacement of a wafer.

As seen from the relationship shown in FIGS. 3 and 4, the pressure of the vapor of the treating liquid in the treating vapor mixture present adjacent the surface of wafer W under treatment may be made saturated vapor pressures $P_A$, $P_B$, $P_C$ and $P_D$ during descent of wafer W by controlling downward displacements of wafer W in response to the variations in the partial pressure ratio of the vapor of the treating liquid (i.e. partial pressure ratios A, B, C and D) such that the surface temperature of wafer W becomes $T_A$, $T_B$, $T_C$ and $T_D$ during the descent of wafer W. FIG. 5 shows how such a control is made for downward displacements of wafer W. In FIG. 5, the vertical axis represents downward displacements of wafer W while the horizontal axis represents time. When, for example, the wafer W is lowered by a distance $D_A$, consuming time $t_A$ after starting the descent of wafer W, the surface of wafer W under treatment is at temperature $T_A$ then. Similarly, when the wafer W is lowered by distances $D_B$, $D_C$ and $D_D$, consuming times $t_B$, $t_C$ and $t_D$ after starting the descent of wafer W, the surface of wafer W under treatment is at temperatures $T_B$, $T_C$ and $T_D$, respectively. Such a relationship may be derived from experiment beforehand.

A reference table showing a relationship between downward displacement of wafer W and time as shown in FIG. 5 is stored in a memory 74 shown in FIG. 2. In lowering the wafer W to the support table 51, the main controller 72 reads the reference table from the memory 74, derives integrated pulse data corresponding to the downward displacements $D_A$, $D_B$, $D_C$ and $D_D$ from the reference table, and determines speed data for each section of the descent (e.g. a gradient of a characteristic curve for each of sections from start of the descent to time $t_A$, from $t_A$ to $t_B$, from $t_B$ to $t_C$ and from $t_C$ to $t_D$ in FIG. 5). These integrated pulse data and speed data are applied as command values to a motor controller 73 for driving the stepping motor 63, thereby to control downward displacements of support pins 61 supporting the wafer W. It will be appreciated from the above description that the main controller 72, motor controller 73 and memory 74 correspond to the drive control device of the apparatus in the first aspect of the invention.

An operation of the above apparatus will be described next.

In an initial state for introducing the wafer W into the treating chamber 50, the main body 52 of the chamber is in an open position, the support pins 61 are in an upper limit position, and the switch valve 41 is closed. After the wafer W is loaded on the support pins 61 by a transport device not shown, the main body 52 is lowered to form the sealed treating space 52a. At this time, the wafer W is in the position (upper limit position) away from the support table 51.

After the main body 52 is lowered, the switch valve 41 is opened to start feeding the treating vapor mixture from the treating vapor mixture generating unit 30 to the treating space 52a. That is, the vapor of the treating liquid generated by the vaporizer 10 is adjusted by the vapor temperature regulator 31 to a temperature close to the substrate treating temperature (i.e. the temperature set to the support table 51), and is thereafter fed to the mixer 38. The main controller 72 controls the flow control valve 39 to adjust the flow rate of the diluting gas so that, as shown in FIG. 3, the partial pressure ratio of the vapor of the treating liquid in the treating vapor mixture increases proportionally with the passage of time. By adjusting the flow rate of the diluting gas as above, the partial pressure ratio of the vapor of the treating liquid in the treating vapor mixture is controlled with high precision. The diluting gas whose flow rate is adjusted by the flow control valve 39 is fed to the mixer 38 after being heated by the heater 40 to a temperature close to the substrate treating temperature. The temperature-adjusted vapor of the treating liquid and the temperature-adjusted diluting gas are mixed by the mixer 38 to form the treating vapor mixture to be fed to the treating chamber 50.

At approximately the same time as the introduction of the treating vapor mixture into the treating space 52a of treating chamber 50, the main controller 72 gives an instruction to the motor controller 73 to drive the substrate lift mechanism 60 to start lowering the support pins 61 supporting the wafer W. Specifically, the main controller 72 reads the reference table from the memory 74 (see FIG. 5) as described hereinbefore, derives integrated pulse data and speed data, and applies these data as command values to the motor controller 73, thereby to control downward displacements of support pins 61. In this embodiment, the support pins 61 are lowered by the screw feed mechanism 64 driven by an electric motor such as the stepping motor 63, which assures a precise control of downward displacements of support pins 61. The downward displacements of wafer W are controlled according to variations in the partial pressure ratio of the vapor of the treating liquid in the treating vapor mixture introduced into the treating space 52a. As a result, the temperature of the surface of wafer W under treatment changes so that the vapor of the treating liquid in the treating vapor mixture present adjacent the surface of wafer W is substantially at a saturation pressure during the descent of wafer W. Thus, the treating vapor mixture introduced into the treating space 52a never condenses on the surface of wafer W during the descent. Since the vapor of the treating liquid is constantly at a saturation pressure adjacent the surface of wafer W, the components of the film formed on the surface of wafer W under treatment disperse only in a minimum amount, thereby effectively preventing a deterioration of the film. After the wafer W is placed on the support table 51, the vapor of the treating liquid is maintained at the partial pressure ratio D in FIG. 3, so that the vapor of the treating liquid in the treating vapor mixture may be at the saturation pressure at the temperature set to the support table 51 (i.e. the substrate treating temperature).

The wafer W is heated in the treating vapor mixture for a predetermined time. Then, the vaporous atmosphere in the treating space 52a is replaced with nitrogen gas or the like by an exhaust mechanism, not shown, provided for the treating chamber 50. At the same time, the support pins 61 are raised to lift the wafer W to the position away from the support table 51. Subsequently, the main body 52 is opened, and the treated wafer W is unloaded from the apparatus which is now ready to treat a next wafer W.

In the above embodiment, the support pins 61 are raised and lowered by the screw feed mechanism 64 driven by an electric motor such as the stepping motor 63. This drive source may be an AC or DC servo motor instead.

<Second Embodiment>

Figure 6:
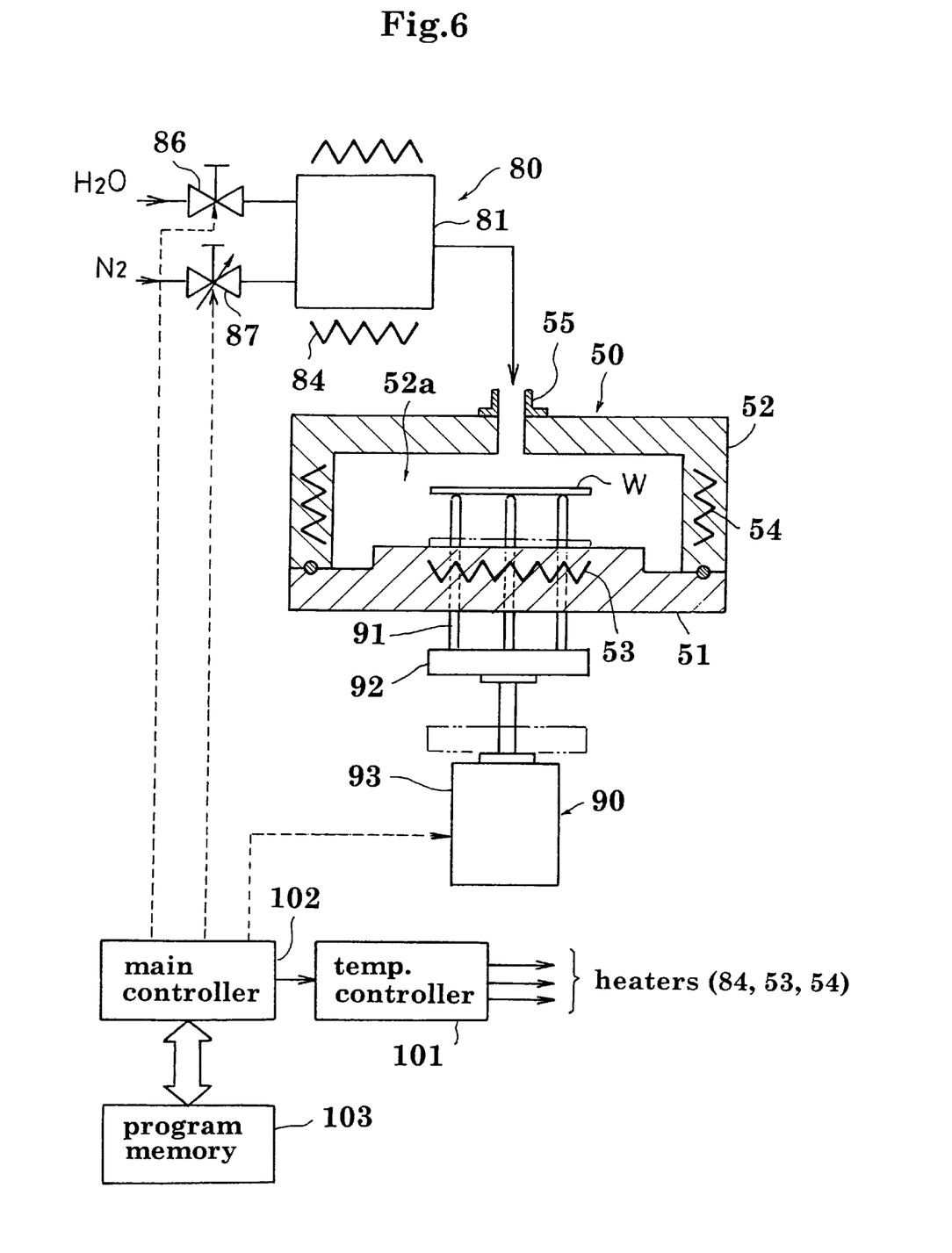
FIG. 6 is a view showing an outline of a substrate treating apparatus in a second embodiment.

FIG. 6 is a schematic view of a substrate treating apparatus in a second embodiment of the invention. This substrate treating apparatus, broadly, is composed of a treating vapor mixture generating unit 80 for generating a treating vapor mixture by mixing the vapor of a treating liquid with a diluting gas, a treating chamber 50 for receiving the treating vapor mixture from the vapor mixture generating unit 80 and heat-treating substrates in the vapor mixture, and a control system for controlling the vapor mixture generating unit 80 and treating chamber 50.

Figure 7:
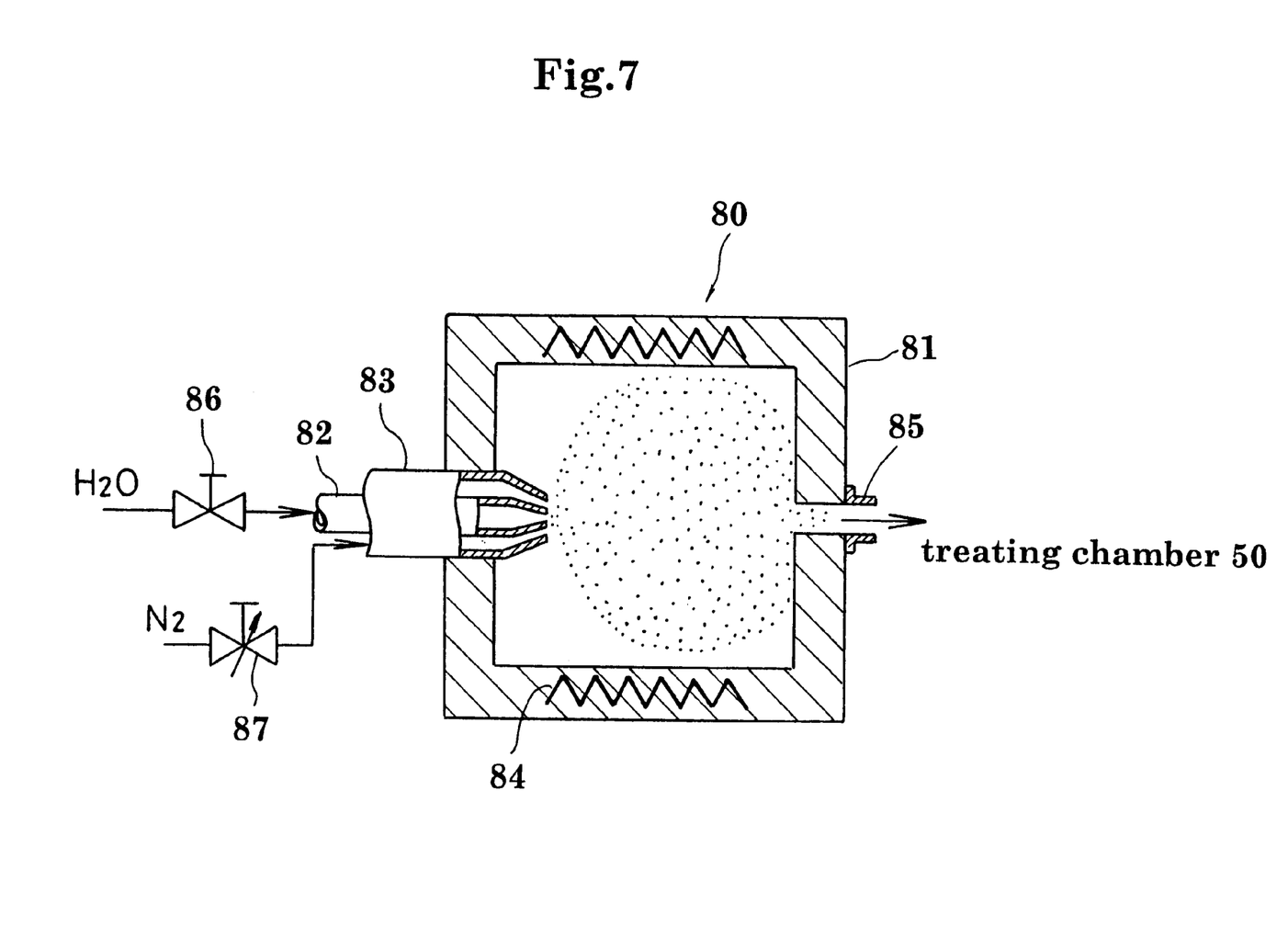
FIG. 7 is a sectional view showing a treating vapor mixture generator.

The vapor mixture generating unit 80 will be described with reference to FIG. 7.

The vapor mixture generating unit 80 includes a receptacle 81 of hermetic structure, with a double pipe connected thereto. The double pipe has an inner pipe 82 and an outer pipe 83, both having restricted ends. The inner pipe 82 feeds a treating liquid such as deionized water ($H_2O$), while the outer pipe 83 feeds a diluting gas such as nitrogen gas ($N_2$). The treating liquid may be ammonia water or an organic solvent instead of deionized water. The treating liquid flowing out of the inner pipe 82 is introduced into the receptacle 81, as dispersed in mist by a high-speed flow of the diluting gas jetting out of the outer pipe 83. The interior of receptacle 81 is heated by a heater 84, whereby the mist of the treating liquid evaporates to become the vapor of the treating liquid. The vapor of the treating liquid is mixed with the diluting gas in the receptacle 81 to form the treating vapor mixture. The treating vapor mixture is transmitted from a vapor outlet 85 disposed in a position of the receptacle 81 opposite the double pipe, to the treating chamber 50. In the treating vapor mixture generating unit 80 having the above construction, a switch valve 86 is disposed on a flow line of the treating liquid, while a flow control valve 87 is disposed on a flow line of the diluting gas.

The treating chamber 50 has the same construction as in the first embodiment. Like reference numerals are used to identify like parts which will not be described again, The treating chamber 50 has a substrate lift mechanism 90 for raising and lowering a wafer W transported into the treating space 52a, between a position separate from the support table 51 and a position on the support table 51. The lift mechanism 90 includes three support pins 91 vertically extending through the support table 51 to be projectable above and retractable below an upper surface of support table 51. The support pins 91 have proximal ends thereof connected to and supported by a support member 92. The support member 92 is connected to a rod of an air cylinder 93.

The control system of the apparatus in this embodiment will be described next.

The heater 84 of the treating vapor mixture generating unit 80 and the heaters 53 and 54 of the treating chamber 50 (which are hereinafter collectively called "heaters") are connected to a temperature controller 101. The temperature controller 101 effects temperature controls of the heaters upon instructions from a main controller 102 for setting temperatures to the heaters. The heater 84 of the treating vapor mixture generating unit 80 has, set thereto, substantially the same temperature as the heater 53 of the treating chamber 50 (the substrate treating temperature). The heaters have temperature sensors, not shown, attached thereto. The temperature sensors transmit detection signals to the temperature controller 101, respectively, for use in the temperature controls of the heaters.

The main controller 102 controls the air cylinder 93, switch valve 86 and flow control valve 87 based on an operating sequence stored in a program memory 103. Specifically, when the lift mechanism 90 lowers the wafer W in the treating chamber 50 from the position separate from the support table 51 to the position on the support table 51, the main controller 102 controls the flow control valve 87 to vary the flow rate of the diluting gas introduced into the treating vapor mixture generating unit 80 according to downward displacements of the wafer W by the lift mechanism 90, thereby to adjust the partial pressure ratio of the vapor of the treating liquid in the treating vapor mixture, such that the vapor of the treating liquid in the treating vapor mixture present adjacent the surface of wafer W under treatment is substantially at a saturation pressure. The main controller 102 and flow control valve 87 correspond to the partial pressure ratio adjusting device of the apparatus in the second aspect of the invention.

An operation of the above apparatus will be described next with reference to FIGS. 8A through 8D.

Figure 8A:
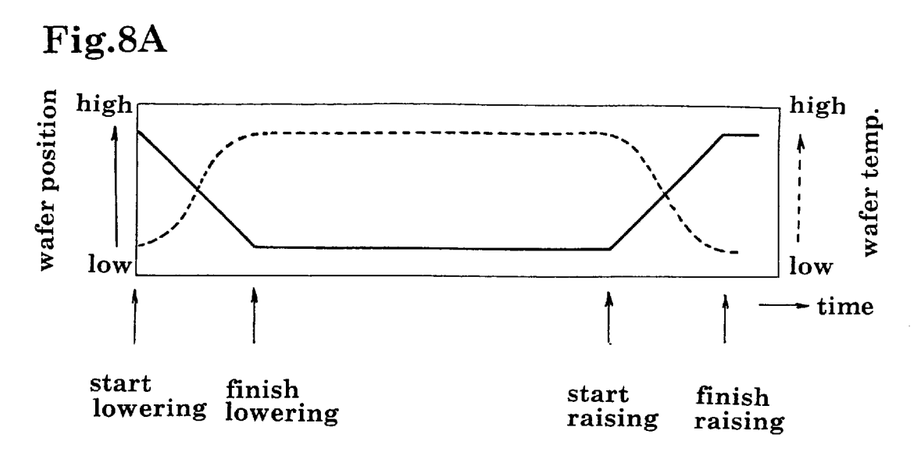
FIG. 8A shows variations in position and temperature of a wafer.
Figure 8B:
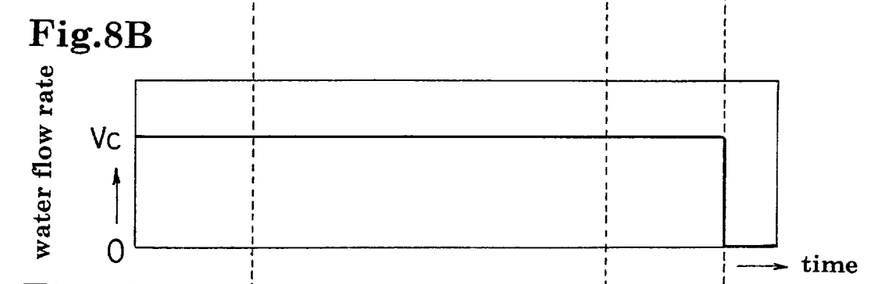
FIG. 8B shows variations in the flow rate of a treating liquid (deionized water)
Figure 8C:
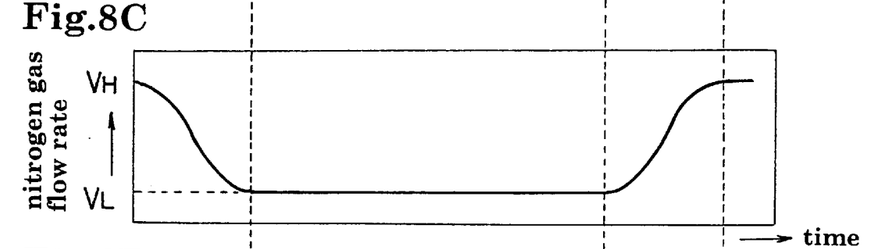
FIG. 8C shows variations in the flow rate of nitrogen gas.
Figure 8D:
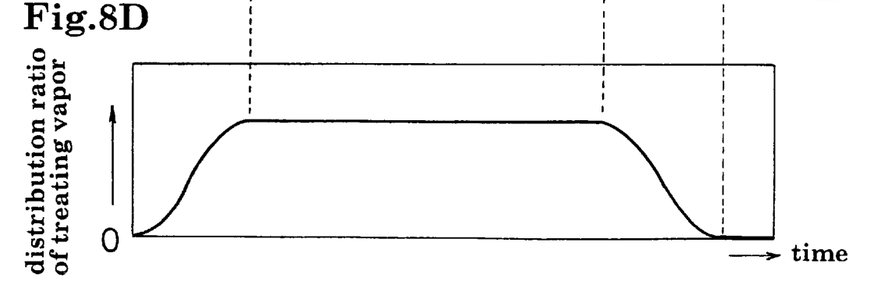
FIG. 8D shows variations in the partial pressure ratio of the vapor of the treating liquid.

FIGS. 8A through 8D show an operating sequence of this apparatus. In particular, FIG. 8A shows variations in position and temperature of the wafer in the treating chamber 50. FIG. 8B shows variations in the flow rate of deionized water introduced into the treating vapor mixture generating unit 80. FIG. 8C shows variations in the flow rate of nitrogen gas introduced into the treating vapor mixture generating unit 80. FIG. 8D shows variations in the partial pressure ratio of the vapor of the treating liquid in the treating vapor mixture.

In an initial state for introducing the wafer W into the treating chamber 50, the main body 52 of the chamber is retracted upward to the open position, and the support pins 91 are in the upper limit position. After the wafer W is loaded on the support pins 91 by the transport device not shown, the main body 52 is lowered to form the sealed treating space 52a. At this time, the wafer W is in the position (upper limit position) away from the support table 51.

After the main body 52 is lowered, the main controller 102 opens the switch valve 86 to introduce the treating liquid into the receptacle 81 of treating vapor mixture generating unit 80, and operates the flow control valve 87 to introduce nitrogen gas into the receptacle 81 of treating vapor mixture generating unit 80. The flow rate of nitrogen gas at this time is set to a predetermined relatively high value (flow rate VH in FIG. 8C). The treating liquid vaporizes and mixes with the nitrogen gas to form the treating vapor mixture in the receptacle 81. The treating vapor mixture is temperature-controlled by the heater 84 to be substantially the same as the substrate treating temperature in the treating chamber 50 (i.e. the temperature set to the support table 51). The treating vapor mixture generated by the treating vapor mixture generating unit 80 is fed to the treating chamber 50.

At substantially the same time as the introduction of the treating vapor mixture into the treating space 52a of treating chamber 50, the main controller 102 drives the air cylinder 93 of substrate lift mechanism 60 to start lowering the support pins 91 supporting the wafer W. In this embodiment, as shown in a solid line in FIG. 8A, the support pins 91 are lowered substantially at a fixed speed. On the other hand, as shown in a broken line in FIG. 8A, the temperature of wafer W gradually increases with downward displacements of wafer W, under the thermal influence of support table 51.

As regards the saturation pressure of the vapor of the treating liquid in the treating vapor mixture present adjacent the surface of wafer W under treatment during the descent, the saturation pressure of the vapor of the treating liquid increases with the temperature of wafer W. In this embodiment, in order that the vapor of the treating liquid in the treating vapor mixture present adjacent the surface of wafer W under treatment during the descent be substantially at the saturation pressure, as shown in FIG. 8D, the partial pressure ratio of the vapor of the treating liquid in the treating vapor mixture is gradually increased according to the downward displacements of wafer W. Specifically, the flow control valve 87 is controlled to decrease the flow rate of the nitrogen gas gradually according to the downward displacements of wafer W as shown in FIG. 8C, thereby to adjust the partial pressure ratio of the vapor of the treating liquid. By controlling the flow rate of the diluting gas as above, the partial pressure ratio of the vapor of the treating liquid may be adjusted with high precision.

Since the wafer W is lowered at a fixed speed in this embodiment, the flow rate of the nitrogen gas to be varied from moment to moment after starting the descent of wafer W is stored in the program memory 103 beforehand. The main controller 102 refers to this flow rate data for operating the flow control valve 87. Such flow rate data may be obtained from experiment. The method of controlling the flow rate of the nitrogen gas is not limited to the above example. The flow rate of the nitrogen gas may be controlled based on actual downward displacements of wafer W detected by an appropriate position sensor.

As described above, the vapor of the treating liquid in the treating vapor mixture present adjacent the surface of wafer W under treatment during the descent is maintained substantially at the saturation pressure by varying the partial pressure ratio of the vapor of the treating liquid in the treating vapor mixture generated by the treating vapor mixture generating unit 80. As a result, the vapor of the treating liquid never condenses on the surface of wafer W during the descent. Since the wafer W is maintained in the vaporous atmosphere of the treating liquid at the saturation pressure constantly throughout the descent, the components of the film formed on the surface of wafer W under treatment disperse only in a minimum amount.

After the wafer W is placed on the support table 51, the vapor of the treating liquid is maintained at a constant partial pressure ratio (FIG. 8D), so that the vapor of the treating liquid in the treating vapor mixture may be at the saturation pressure at the temperature set to the support table 51 (i.e. the substrate treating temperature). The wafer W is heated in the treating vapor mixture for a predetermined time. Then, the support pins 91 are raised to return the wafer W to the position away from the support table 51. The temperature of wafer W lowers gradually during the ascent of wafer W (FIG. 8A). Conversely to the descent noted above, the flow rate of the nitrogen gas is gradually increased to lower the partial pressure ratio of the vapor of the treating liquid in the treating vapor mixture (FIGS. 8A and 8D). As a result, the vapor of the treating liquid is prevented from condensing on the surface of wafer W during the ascent. It is not absolutely necessary to control the partial pressure ratio of the vapor of the treating liquid during the ascent of wafer W since the heat treatment of wafer W has already been completed. Simultaneously with the start of the ascent of wafer W, the feeding of the treating vapor mixture to the treating chamber 50 may be stopped and the gas may be exhausted from the treating chamber 50.

When the ascent of wafer W is completed, the switch valve 86 is closed to stop feeding the treating vapor mixture to the treating chamber 50. The vaporous atmosphere in the treating space 52a is replaced with nitrogen gas by the exhaust mechanism, not shown, provided for the treating chamber 50. Subsequently, the main body 52 is opened, and the treated wafer W is unloaded from the apparatus which is now ready to treat a next wafer W.

The present invention is not limited to the foregoing embodiments, but may be modified as follows:

(1) The treating vapor mixture generating unit 30 in the first embodiment may be replaced with the treating vapor mixture generating unit 80 in the second embodiment. Similarly, the treating vapor mixture generating unit 80 in the second embodiment may be replaced with the treating vapor mixture generating unit 30 in the first embodiment.

(2) In the first and second embodiments, the partial pressure ratio of the vapor of the treating liquid in the treating vapor mixture is varied by adjusting the mixing quantity of the diluting gas. The partial pressure ratio of the vapor of the treating liquid in the treating vapor mixture may be varied by adjusting the mixing quantity of the vapor of the treating liquid while maintaining the mixing quantity of the diluting gas constant. As a further option, the mixing quantities of both the vapor of the treating liquid and the diluting gas may be adjusted.

(3) In the first embodiment, the downward displacements of the wafer are controlled so that the vapor of the treating liquid in the treating vapor mixture present adjacent the surface of the wafer under treatment may be substantially at the saturation pressure. The vapor of the treating liquid may not necessarily be at the saturation pressure. It is adequate if, during descent of the wafer, substantially a constant ratio is maintained between the vapor pressure and saturation pressure of the vapor of the treating liquid in the treating vapor mixture present adjacent the surface of the wafer under treatment. Then, the vapor of the treating liquid is prevented from condensing on the wafer, and the wafer is treated in a stable atmosphere of the treating vapor mixture.

Similarly, in the second embodiment, the partial pressure ratio of the vapor of the treating liquid in the treating vapor mixture is adjusted so that the vapor of the treating liquid in the treating vapor mixture present adjacent the surface of the wafer under treatment may be substantially at the saturation pressure. The vapor of the treating liquid may not necessarily be at the saturation pressure. It is adequate if, during descent of the wafer, substantially a constant ratio is maintained between the vapor pressure and saturation pressure of the vapor of the treating liquid in the treating vapor mixture present adjacent the surface of the wafer under treatment.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for heating a substrate in an atmosphere including vapor of a treating liquid, comprising:

treating vapor mixture generating means for generating a treating vapor mixture by mixing the vapor of the treating liquid with a diluting gas;

a treating chamber for receiving said treating vapor mixture;

a substrate support table disposed in said treating chamber, heated to a predetermined temperature and for supporting the substrate;

a substrate lift mechanism for raising and lowering the substrate between a separate position away from said substrate support table and a resting position on said substrate support table;

partial pressure ratio adjusting means for varying a mixing quantity of at least one of the vapor of the treating liquid and the diluting gas, so that a partial pressure ratio of the vapor of the treating liquid in the treating vapor mixture generated by said treating vapor mixture generating means increases with time; and drive control means for controlling downward displacements of the substrate lowered by said substrate lift mechanism from said separate position to said resting position in said treating chamber, according to variations in the partial pressure ratio of the vapor of the treating liquid in said treating vapor mixture, to maintain a substantially fixed ratio between a vapor pressure and a saturation pressure of the vapor of the treating liquid in the treating vapor mixture adjacent a surface of said substrate under treatment.

2. A substrate treating apparatus as defined in claim 1, wherein said treating vapor mixture generating means includes a bubbling tank for generating the vapor of the treating liquid by heating the treating liquid, and a mixer for mixing the vapor of the treating liquid generated in said bubbling tank with the diluting gas.

3. A substrate treating apparatus as defined in claim 2, wherein said treating vapor mixture generating means further includes a vapor temperature regulator for cooling the vapor of the treating liquid generated in said bubbling tank, to a temperature close to the temperature set to said substrate support table, before transmitting the vapor to said mixer.

4. A substrate treating apparatus as defined in claim 1, wherein said treating vapor mixture generating means includes a sealed receptacle, a double pipe opening to said receptacle, and a heater for heating an interior of said receptacle, said double pipe having an inner pipe for feeding the treating liquid, and an outer pipe for feeding the diluting gas, said inner pipe and said outer pipe having restricted ends, a vapor transmitting pipe being connected to a position of said receptacle opposite to said double pipe.

5. A substrate treating apparatus as defined in claim 1, wherein said partial pressure ratio adjusting means is operable for varying the mixing quantity of the diluting gas mixed into said treating liquid.

6. A substrate treating apparatus as defined in claim 1, wherein said substrate lift mechanism includes a plurality of support pins projectable from said substrate support table for supporting the substrate, and a screw feed mechanism driven by an electric motor for raising and lowering a support member supporting said support pins.

7. A substrate treating apparatus as defined in claim 1, wherein said drive control means is operable for controlling downward displacements of the substrate lowered by said substrate lift mechanism from said separate position to said resting position in said treating chamber, according to variations in the partial pressure ratio of the vapor of the treating liquid in said treating vapor mixture, to maintain the vapor of the treating liquid in the treating vapor mixture adjacent the surface of said substrate under treatment substantially at the saturation pressure.

8. A substrate treating apparatus for heating a substrate in an atmosphere including vapor of a treating liquid, comprising:

treating vapor mixture generating means for generating a treating vapor mixture by mixing the vapor of the treating liquid with a diluting gas;

a treating chamber for receiving said treating vapor mixture;

a substrate support table disposed in said treating chamber, heated to a predetermined temperature and for supporting the substrate;

a substrate lift mechanism for raising and lowering the substrate between a separate position away from said substrate support table and a resting position on said substrate support table; and partial pressure ratio adjusting means for adjusting a partial pressure ratio of the vapor of the treating liquid in the treating vapor mixture by varying a mixing quantity of at least one of the vapor of the treating liquid and the diluting gas in said treating vapor mixture generating means, according to downward displacements of the substrate, to maintain a substantially fixed ratio between a vapor pressure and a saturation pressure of the vapor of the treating liquid in the treating vapor mixture adjacent a surface of said substrate under treatment when the substrate is lowered by said substrate lift mechanism from said separate position to said resting position in said treating chamber.

9. A substrate treating apparatus as defined in claim 8, wherein said treating vapor mixture generating means includes a bubbling tank for generating the vapor of the treating liquid by heating the treating liquid, and a mixer for mixing the vapor of the treating liquid generated in said bubbling tank with the diluting gas.

10. A substrate treating apparatus as defined in claim 9, wherein said treating vapor mixture generating means further includes a vapor temperature regulator for cooling the vapor of the treating liquid generated in said bubbling tank, to a temperature close to the temperature set to said substrate support table, before transmitting the vapor to said mixer.

11. A substrate treating apparatus as defined in claim 8, wherein said treating vapor mixture generating means includes a sealed receptacle, a double pipe opening to said receptacle, and a heater for heating an interior of said receptacle, said double pipe having an inner pipe for feeding the treating liquid, and an outer pipe for feeding the diluting gas, said inner pipe and said outer pipe having restricted ends, a vapor transmitting pipe being connected to a position of said receptacle opposite to said double pipe.

12. A substrate treating apparatus as defined in claim 8, wherein said partial pressure ratio adjusting means is operable for varying the mixing quantity of the diluting gas mixed into said treating liquid.

13. A substrate treating apparatus as defined in claim 8, wherein said partial pressure ratio adjusting means is operable for adjusting the partial pressure ratio of the vapor of the treating liquid in the treating vapor mixture by varying a mixing quantity of at least one of the vapor of the treating liquid and the diluting gas in said treating vapor mixture generating means, according to downward displacements of the substrate, to maintain the vapor of the treating liquid in the treating vapor mixture adjacent the surface of said substrate under treatment substantially at the saturation pressure when the substrate is lowered by said substrate lift mechanism from said separate position to said resting position in said treating chamber.

* * * * *